United States Patent [19]

Wen

[11] Patent Number: 5,781,467
[45] Date of Patent: Jul. 14, 1998

[54] DECODING METHOD FOR ROM MATRIX HAVING A SILICON CONTROLLED RECTIFIER STRUCTURE

[75] Inventor: Jemmy Wen, Hsinchu City, Taiwan

[73] Assignee: United Integrated Circuits Corp., Hsinchu City, Taiwan

[21] Appl. No.: 907,004

[22] Filed: Aug. 6, 1997

[30] Foreign Application Priority Data

May 13, 1997 [TW] Taiwan ................ 86106329

[51] Int. Cl.[6] .................................... G11C 13/00
[52] U.S. Cl. ................................ 365/103; 365/174
[58] Field of Search ................ 365/49, 103, 104, 365/105, 174, 180, 175

[56] References Cited

U.S. PATENT DOCUMENTS 4,646,271  2/1987  Uchiyama et al. ............. 365/49

Primary Examiner—Terrell W. Fears
Attorney, Agent, or Firm—Finnegan, Henderson, Farabow, Garrett & Dunner, L.L.P.

[57] ABSTRACT

A decoding method is used for a ROM matrix having silicon controlled rectifier memory units. In the memory units a voltage is applied to the emitter terminal and the base terminal of the first transistor of a silicon controlled rectifier unit so that the silicon controlled rectifier memory unit is operational. Current flows via the emitter terminal of the second transistor of the silicon controlled rectifier unit to the common electrode and can be detected. Decoding comprises selecting a memory unit for a read operation by applying a first voltage to the triggering word line electrode, that is electrically coupled to the selected memory unit, while applying a second voltage which is bigger than the first voltage to the remaining triggering word line electrodes. A first voltage is also applied to the bit line electrode that is electrically coupled to the selected memory unit while applying a third voltage smaller than both the first voltage and the second voltage or an earth connection to the remaining bit line electrodes.

8 Claims, 7 Drawing Sheets

DECODING METHOD FOR ROM MATRIX HAVING A SILICON CONTROLLED RECTIFIER STRUCTURE

BACKGROUND OF THE INVENTION

The present invention relates to a decoding method for read-only-memories (ROMs), and more particularly to a decoding method for a ROM matrix having a silicon controlled rectifier structure.

ROMs are now widely used in digital equipment such as microcomputers and microprocessor operating systems. Resident programs used by operating systems, such as the BIOS, are normally kept in ROMs because they maintain data even during power outage.

In general, a channel transistor is employed as a basic memory unit for a ROM. During the programming phase, ions are selectively implanted into specified channels of each channel transistor to adjust the threshold voltage, thus achieving the desired ON/OFF states for the channel transistors. FIG. 1 shows a top view of a conventional ROM structure. The polysilicon word lines (WLs) 10 cross over the bit lines (BLs), and the channel region of a memory unit is formed between two bit lines 12 and underneath the WLs 10. Whether a binary bit of "0" or "1" is permanently stored in the binary level memory unit is determined solely by whether ions are implanted into the channel 14 of the memory unit.

FIG. 2 shows a circuit diagram equivalent to the structure shown in FIG. 1. ROM 20 is comprised of a plurality of parallel ranked WLs and a plurality of parallel ranked BLs. Data is stored in ROM unit 20 by program coding in the memory units located at the junction formed by the crossing of a word line over a bit line. For example, data is stored in the memory units at the crossover junctions by setting the desired threshold voltage at each memory unit. A logic "0" (ON state) is stored in the transistor 22 by forming a relatively low threshold voltage transistor 22 between bit lines BL1 and BL2, and underneath the word line WL2. Similarly, a logic "1" (OFF state) is stored in the transistor 24 between bit lines BL3 and BL4, and underneath the word line WL1.

Data is read from a particular memory unit by applying a specific potential difference via the corresponding bit line and word line, and then sensing any current change in the bit line to determine whether the transistor of the particular memory unit selected has a relatively high or low threshold voltage. For example, when a high voltage is applied to both the word line WL2 and the bit line BL2 while a low voltage is applied to bit line BL3 for the selection of transistor 22, which has a relatively low threshold voltage, current will be flowing from bit line BL2, which is at a higher potential, through the conducting transistor 22 into the bit line BL3, which is at a lower potential, therefore a large current is detected in the bit line BL2 as shown by an arrow 25 in FIG. 2. By sensing the current there, the fact that a logic "0" (ON state) is stored in the binary level memory unit 22 can be ascertained. To make absolutely certain that no current will be flowing from bit line BL2 towards bit line BL1 owing to a similarly low threshold voltage for the adjacent memory unit 26, however, a high voltage needs to be applied for bit line BL1 with the remaining bit lines in a floating state.

Similarly, when a high voltage is applied both to the word line WL1 and the bit line BL3, while a low voltage is applied to bit line BL4 for the selection of transistor 24, which has a relatively high threshold voltage, current is unable to flow from bit line BL3 through transistor 24 into bit line BL4 because the intrinsic high threshold voltage of transistor 24 makes its channel virtually non-conducting despite the application of a high voltage at its gate word line WL1. By observing that there is no current change in the bit line BL3, the fact that a logic "1" or an OFF state is stored in the binary level memory unit can be ascertained.

The aforementioned decoding method is only suitable for a conventional ROM unit that uses a channel transistor as a basic memory unit. When the basic memory unit is a silicon controlled rectifier the conventional decoding method is inappropriate and another decoding method must be set up for data reading operations.

SUMMARY OF THE INVENTION

It is therefore an object of this invention to provide a decoding method specially suitable for a ROM matrix that uses silicon controlled rectifiers as memory units.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

Consistent with the principles disclosed herein, a silicon controlled rectifier ROM matrix structure is comprised of at least a column and at least a row of memory units, with each column and each row comprised of a plurality of memory units respectively, and that the memory units are comprised of a plurality of type one memory units having a logic value of "1," as well as a plurality of type two memory unit having a logic value of "0". The silicon controlled rectifier memory unit is constructed from a combination of a first transistor and a second transistor, with the first transistor having a PNP structure and the second transistor having a NPN structure. In addition, for each memory unit, the base terminal of the first transistor is electrically coupled to a triggering word line electrode while the emitter terminal is electrically coupled to a bit line electrode. Furthermore, memory units along the same row are electrically coupled to the same triggering word line electrode while memory units residing in different rows are electrically coupled to different triggering word line electrodes. Memory units along the same column are electrically coupled to the same bit line electrode while memory units residing in different columns are coupled to different bit line electrodes. Also, for each memory unit, the emitter terminal of the second transistor is electrically coupled to the common electrode.

A decoding method consistent with the principles of the invention disclosed herein is comprised of:

applying a first voltage to a triggering word line electrode connected to a memory unit to be read while applying a second voltage to the remainder of triggering word line electrodes, wherein the second voltage is greater than the first voltage;

applying the first voltage to a bit line electrode connected to the memory unit to be read while applying a third voltage to the remainder of the bit line electrodes, wherein the third voltage is less than both the first and the second voltages;

applying the third voltage to the common electrode; and decoding by sensing current flowing in the common electrode.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF A PREFERRED EMBODIMENT

Reference will now be made in detail to preferred embodiments consistent with the principles of the invention, examples of which are illustrated in the accompany drawings. Wherever possible, the same reference numbers will be used throughout the drawings to refer to the dame or like parts.

Figure 1:
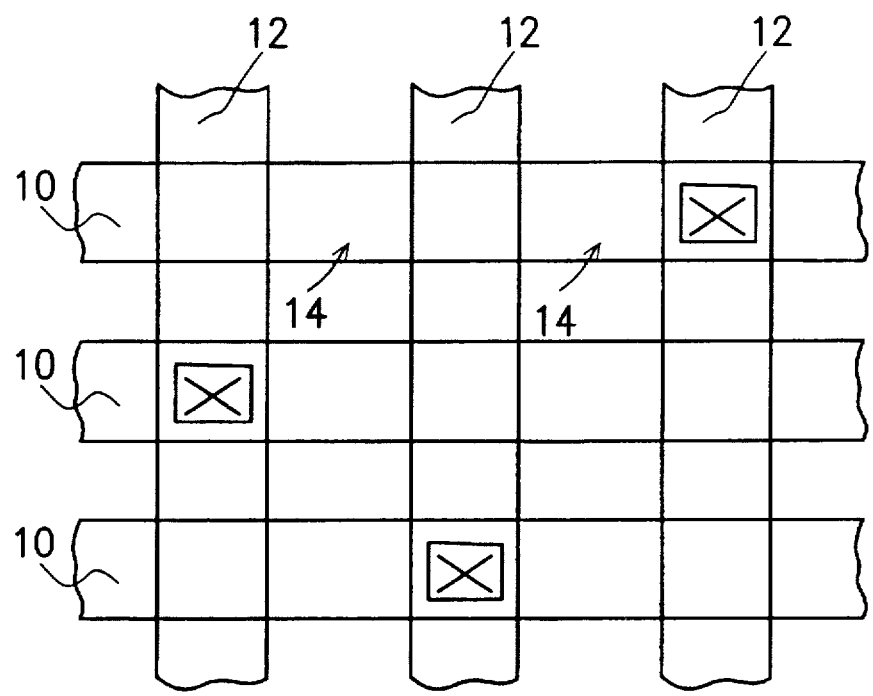
FIG. 1 shows part of the top view of a conventional ROM.
Figure 2:
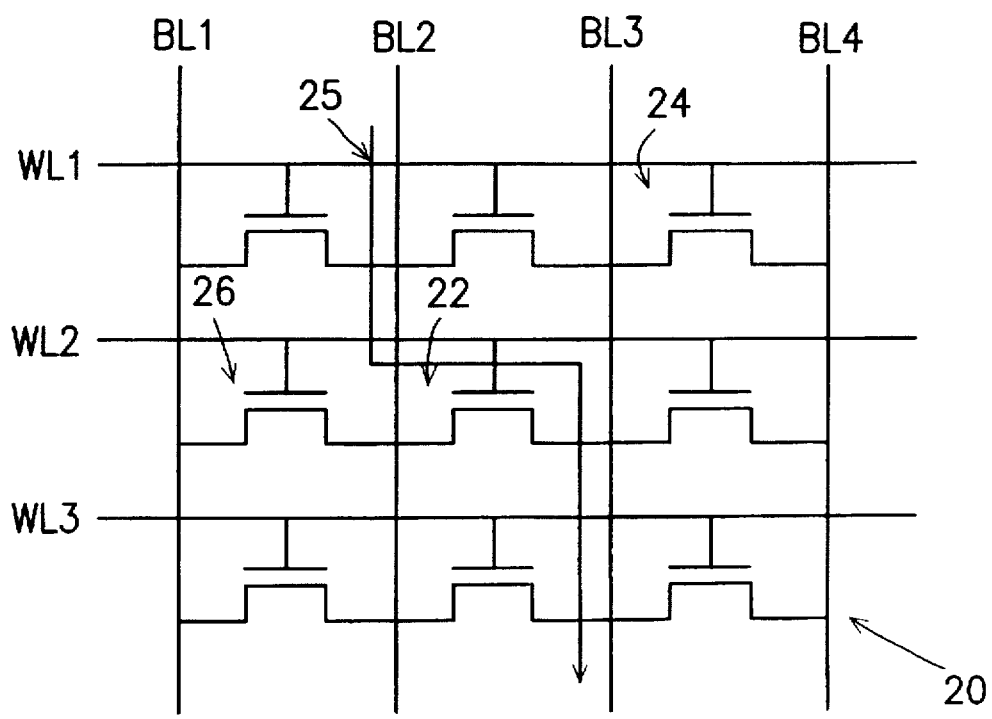
FIG. 2 shows part of the equivalent circuit diagram of a conventional ROM.
Figure 3A:
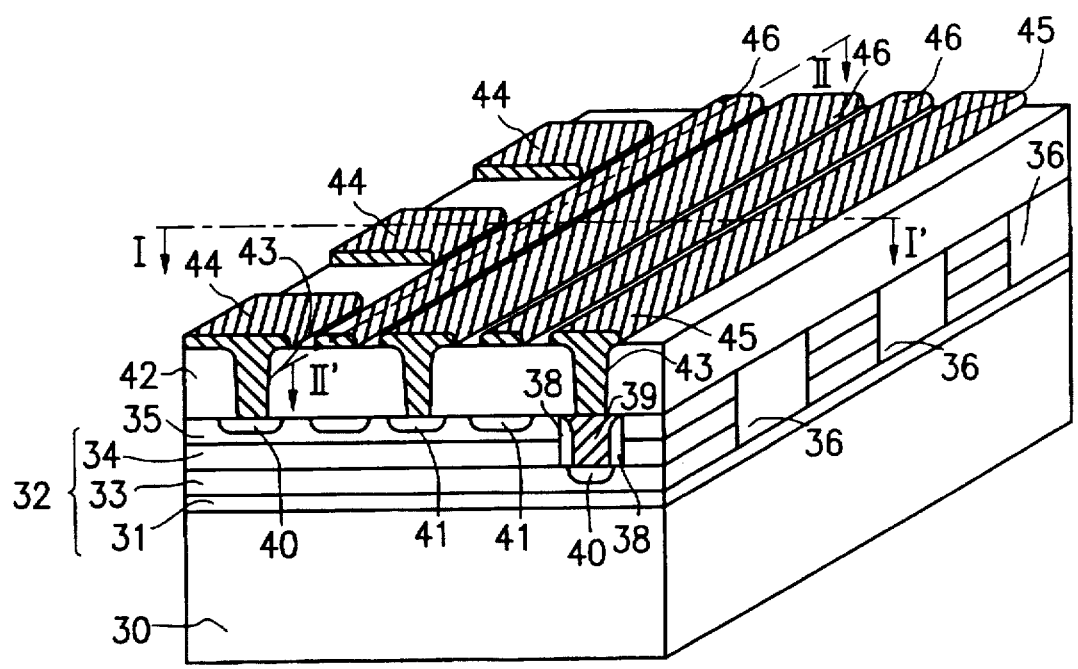
FIG. 3A shows part of the three-dimensional view of a silicon controlled rectifier ROM structure according to one preferred embodiment of the invention.
Figure 3B:
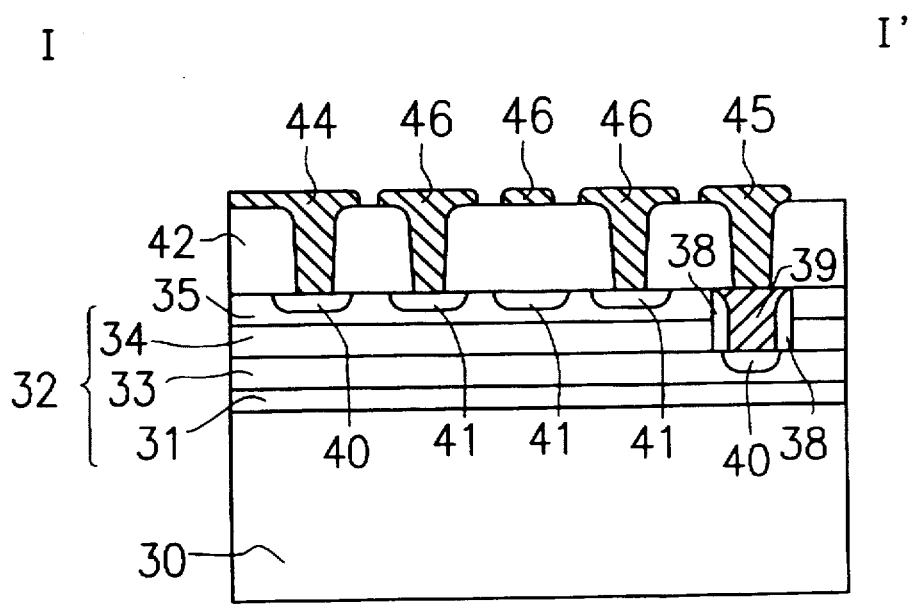
FIGS. 3B and 3C are cross-sectional views showing a silicon controlled rectifier ROM structure according to one preferred embodiment of the invention.
Figure 3C:
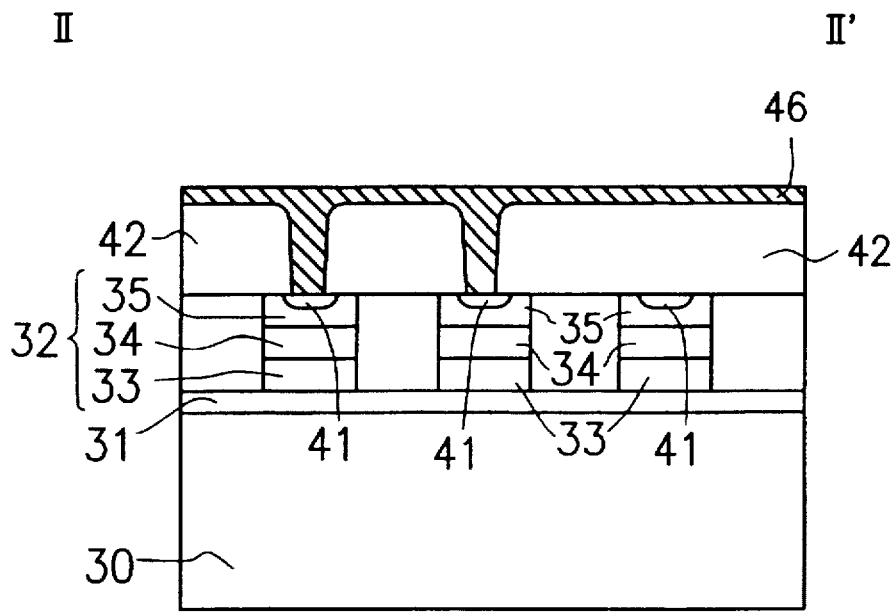

FIG. 3A shows a three-dimensional view of a silicon controlled rectifier ROM structure consistent with the principles of the present invention. FIGS. 3B and 3C are cross-sectional views along line I—I and II—II, respectively, of FIG. 3A. Referring first to FIG. 3A, a substrate 30 having an insulating layer 31 formed on top is provided. Above the insulating layer 31 are a plurality of separate parallel bit lines 32 composed of, in upward sequence from the insulating layer 31 surface, a heavily doped N-type impurity layer 33, a lightly doped P-type impurity region 34 and a lightly doped N-type impurity region 35, and in between the bit lines 32 are insulating layers 36 for isolation purposes.

Each bit line 32 has a contact window, shown filled with conducting layer 39 in FIG. 3A, exposing the heavily doped N-type impurity layer 33 and having sidewall spacers 38 on the sidewalls of the contact window. The contact window is back filled with a conducting layer 39, and an N-type diffusion region 40 is formed both in the heavily doped N-type impurity layer 33 underneath the exposed portion at the bottom of the contact window and the lightly doped N-type impurity region 35 of bit line 32. Furthermore, a plurality of heavily doped P-type diffusion regions 41 are formed in the lightly doped N-type impurity region 35 of bit line 32.

On the surface of the insulating layers 36 and bit lines 32, an insulating layer 42 is formed having a plurality of contact windows 43, exposing conducting layers 39, the N-type diffusion regions 40 in the lightly doped N-type impurity layer 35 and the heavily doped P-type diffusion regions 41 in the lightly doped N-type impurity layer 35.

Above the N-type diffusion region 40 in the lightly doped N-type impurity layer 35, there is a triggering word line electrode 44 electrically coupled to the N-type diffusion region 40 through a contact window 43. Above the conducting layer 39, there is a common electrode 45 electrically coupled to the conducting layer 39 also through a contact window 43. And above the insulating layer 42, there are a plurality of bit line electrodes 46 filling up the contact window 43 above the P-type diffusion regions 41. The bit lines 32 cross over the bit line electrodes 46 at an angle, (e.g., at an approximately right angle) and at the junction crossing between a bit line 32 and a bit line electrode 46 a PNPN type silicon controlled rectifier memory unit is formed. If there is a contact window 43 in the silicon controlled rectifier memory unit such that the bit line electrode 46 is electrically coupled to the heavily doped P-type diffusion region 41, then the silicon controlled rectifier memory unit becomes an ON state memory unit 50. If there is no contact window 43 in the silicon controlled rectifier, however, then the memory unit becomes an OFF state memory unit 52.

Figure 4:
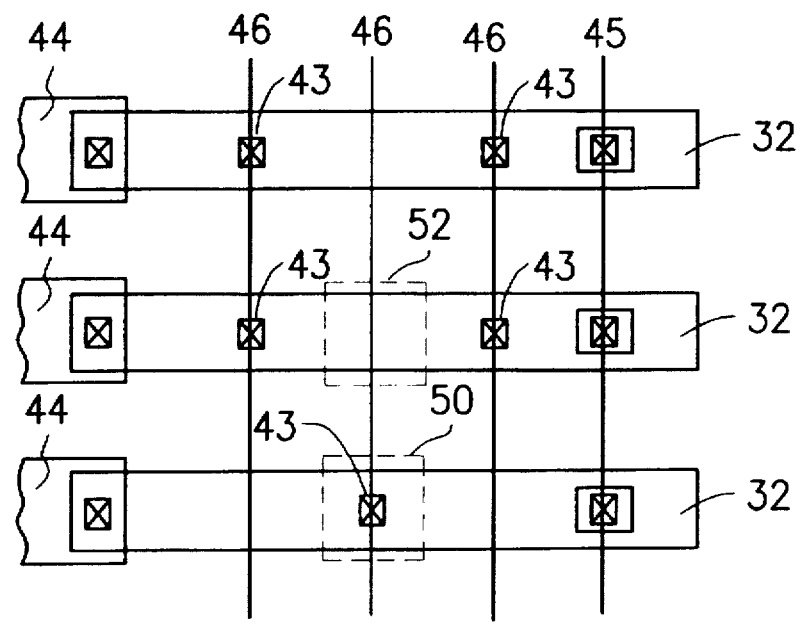
FIG. 4 shows part of the top view of a silicon controlled rectifier ROM according to one preferred embodiment of the invention.

FIG. 4 shows a top view of a silicon controlled rectifier ROM consistent with the invention as described herein. In FIG. 4, the locations marked X represent contact window positions 43. The memory units having a contact window 43 are ON state memory units 50, whereas memory units without any contact window 43 are OFF state memory units 52.

The silicon controlled rectifier ROM matrix according to the invention includes at least a row and at least a column of memory units, and for each row and each column, there are at least a plurality of memory units. Furthermore, among those memory units a plurality of memory units having a logic value "1" (ON state), and a plurality of memory units having a logic value "0" (OFF state), and each memory unit is electrically coupled to a bit line electrode and a triggering word line electrode respectively. Memory units in the same row are electrically coupled to the same triggering word line electrode, and memory units in different rows are electrically coupled to different triggering word line electrodes. Similarly, the memory units in the same column are electrically coupled to the same bit line electrode, and memory units in different columns are electrically coupled to different bit line electrodes.

Figure 5A:
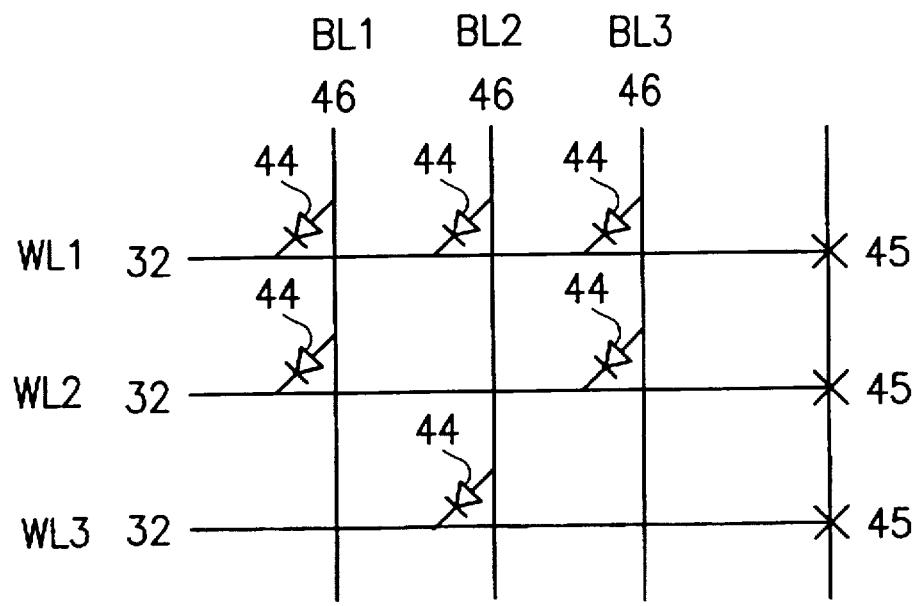
FIG. 5A shows part of the equivalent circuit diagram of a PNPN type silicon controlled rectifier ROM according to one preferred embodiment of the invention.
Figure 5B:
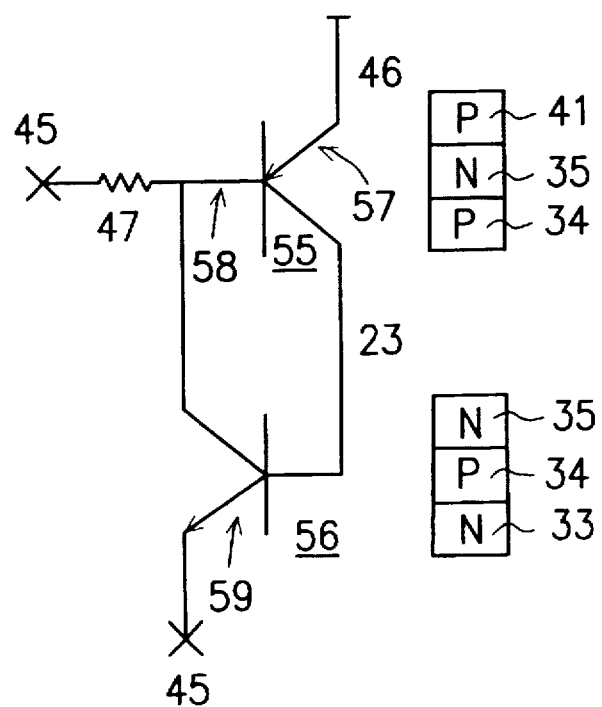
FIG. 5B shows an equivalent circuit diagram of the memory unit of a PNPN type silicon controlled rectifier ROM according to one preferred embodiment of the invention.

FIG. 5A shows details of a method of memory unit decoding for a silicon controlled rectifier ROM matrix consistent with the principles of the invention. FIG. 5A shows a portion of the circuit diagram of a silicon controlled rectifier ROM according to one preferred embodiment consistent with the principles of the invention described herein and FIG. 5B shows an operating circuit diagram for one of its memory units. Referring to FIG. 5B, a silicon controlled rectifier ROM memory unit is constructed from a transistor 55 and another transistor 56, with transistor 55 having a PNP structure and transistor 56 having an NPN structure. The bit line electrode 46 is electrically coupled to the emitter 57 of transistor 55; the triggering word line electrode 44, connected in series with a resistor 47, is electrically coupled to the base terminal 58 of transistor 55; and the common electrode 45 is electrically coupled to the emitter terminal 59 of the transistor 56. In a reading mode a suitable voltage is applied to both word line electrode 44 and bit line electrode 46 of the selected memory unit. If the memory unit is in an ON state (e.g., memory unit 50), then a forward biasing voltage will lead to conduction of transistor 55 and transistor 56 (Gain>1), and current will flow from contact window 43 via the silicon controlled rectifier structure formed by the second type diffusion region 41 and bit line 32, and a current will be detected in common electrode 45. If the memory unit is in an OFF state (e.g., memory unit 52), transistor 55 is under reverse bias and is therefore non-conducting, so current cannot flow to the common electrode 45 via the silicon controlled rectifier structure. Thus, no current is detected there.

Figure 6A:
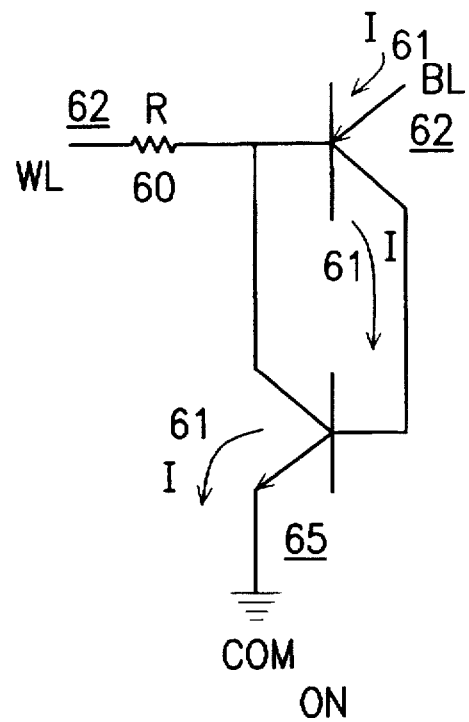
FIGS. 6A through 6D are a series of equivalent circuit diagrams of a memory unit in a PNPN type silicon controlled rectifier ROM under different operating setup conditions according to one preferred embodiment of the invention.
Figure 6B:
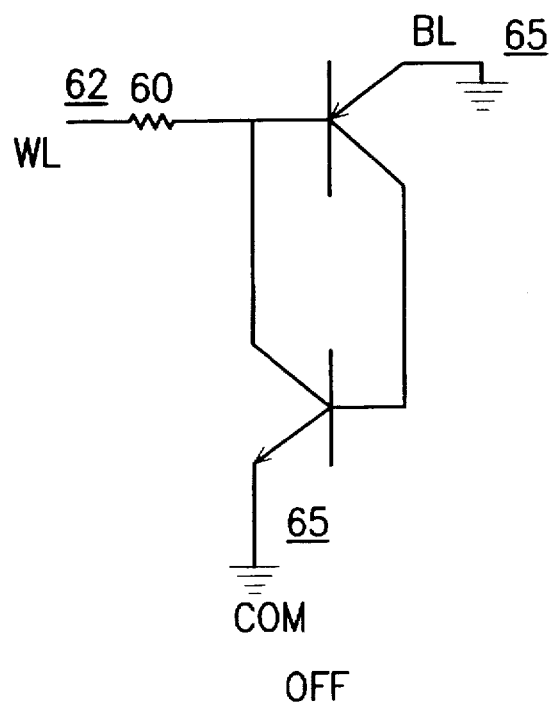
Figure 6C:
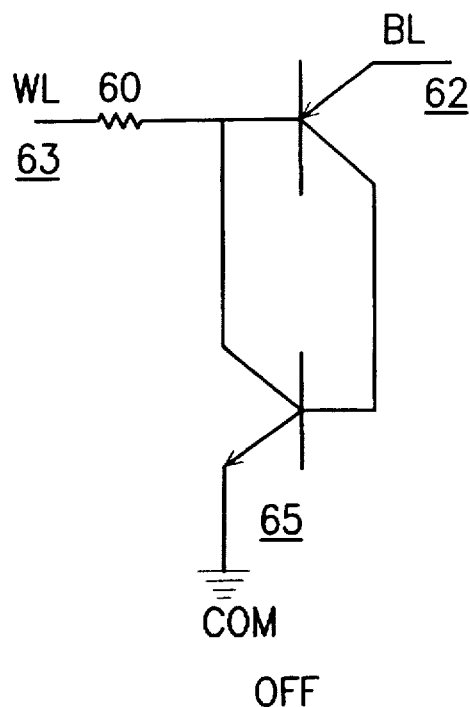
Figure 6D:
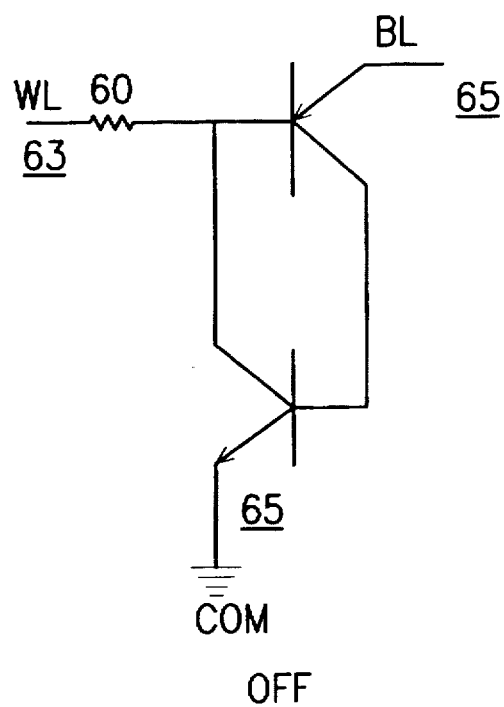

FIGS. 6A through 6D are a series of equivalent circuit diagrams of a memory unit in a PNPN type silicon controlled rectifier ROM under different operating setup conditions according to one preferred embodiment of the invention. Referring to FIG. 6A, a memory unit 50 (e.g., a memory unit having a contact window 43 or a conducting memory unit, as shown in FIG. 4) is selected for a data read operation by applying a first voltage 62 of, for example, about 2.5V, to the triggering word line electrode WL, and applying a second voltage 63 of, for example, about 5V, to the remaining non-selected triggering word line electrodes such that the second voltage 63 after a voltage drop through a resistor 60 is still greater than the first voltage 62. The word line electrode WL is connected to a resistor 60 which can act as a device for the downward adjustment of incoming word line electrode WL voltage. Also, a voltage exactly the same as the first voltage 62 of, for example, about 2.5V, is applied to the bit line electrode BL of the electrically coupled memory unit 50, and a third voltage 65 is applied to the remaining non-selected bit line electrodes such that the third voltage is smaller than both the first voltage 62 and the second voltage 63, or is directly connected to earth. Lastly, a third voltage 65 is also provided for the common electrode COM. With the above electrical arrangements, the silicon controlled rectifier structure is conducting and current is capable of flowing from the bit line electrode BL1 to common electrode COM, as shown by the arrows 61 in FIG. 6A. Current detected in the common electrode can be used for decoding purposes and that the stored data bit in memory unit 50 can be regarded as having a logic "1," or an ON state, as shown in FIG. 6A. Owing to the shut-off configuration for the remaining non-selected silicon controlled rectifier memory units, as shown in the circuit diagrams from FIGS. 6B through 6D, current will not flow from them and no decoding acts are attempted.

On the other hand, if the selected memory unit is for a read operation of, for example, memory unit 52 without a contact window 43 or a non-conducting memory unit, when a similar decoding act as described above is performed, then current will not flow from the bit line electrode BL towards the common electrode COM. Undetectable current change in the common electrode can be regarded as a logic "0" or an OFF state stored in the memory unit 52.

The decoding voltages with reference to a memory unit in FIG. 5A is summarized in Table 1 below following the decoding method as described in the preferred embodiment of the invention. In Table 1, $V_1$ represents the first voltage, $V_2$ represent the second voltage and $V_L$ represents the third voltage, and their voltage relationship can be briefly summarized by the following inequality as follows:

$$V_2 >> V_1 > V_L;$$

for the selected memory unit: $WL=V_1$; $BL=V_1$; and for the non-selected memory units: $WL=V_2$; $BL=V_L$; and the common electrode for both the selected and non-selected memory units: $COM=V_L$.

TABLE NO. 1

| Read Cell | WL1 | WL2 | WL3 | BL1 | BL2 | BL3 | COM |
|---|---|---|---|---|---|---|---|
| Cell₁₁ (WL = 1, BL = 1) | $V_1$ | $V_2$ | $V_2$ | $V_1$ | $V_L$ | $V_L$ | $V_L$ |
| Cell₁₂ (WL = 1, BL = 2) | $V_1$ | $V_2$ | $V_2$ | $V_L$ | $V_1$ | $V_L$ | $V_L$ |
| Cell₂₁ (WL = 2, BL = 1) | $V_2$ | $V_1$ | $V_2$ | $V_1$ | $V_L$ | $V_L$ | $V_L$ |
| Cell₃₃ (WL = 3, BL = 3) | $V_2$ | $V_2$ | $V_1$ | $V_L$ | $V_L$ | $V_1$ | $V_L$ |

According to the decoding method of the invention, whenever there is a contact window 43 formed above a memory unit, that memory unit is conducting, and when a decoding act is performed, current will be detected in the common electrode coming from the selected conducting silicon controlled rectifier memory unit, while all the remaining non-selected silicon controlled rectifier memory units will be non-conducting, and no current will be flowing to the common electrode from them. On the contrary, whenever there is no contact window formation 43 above a memory unit, that silicon controlled rectifier cannot be conducting, and so the memory unit is shut off.

Figure 7:
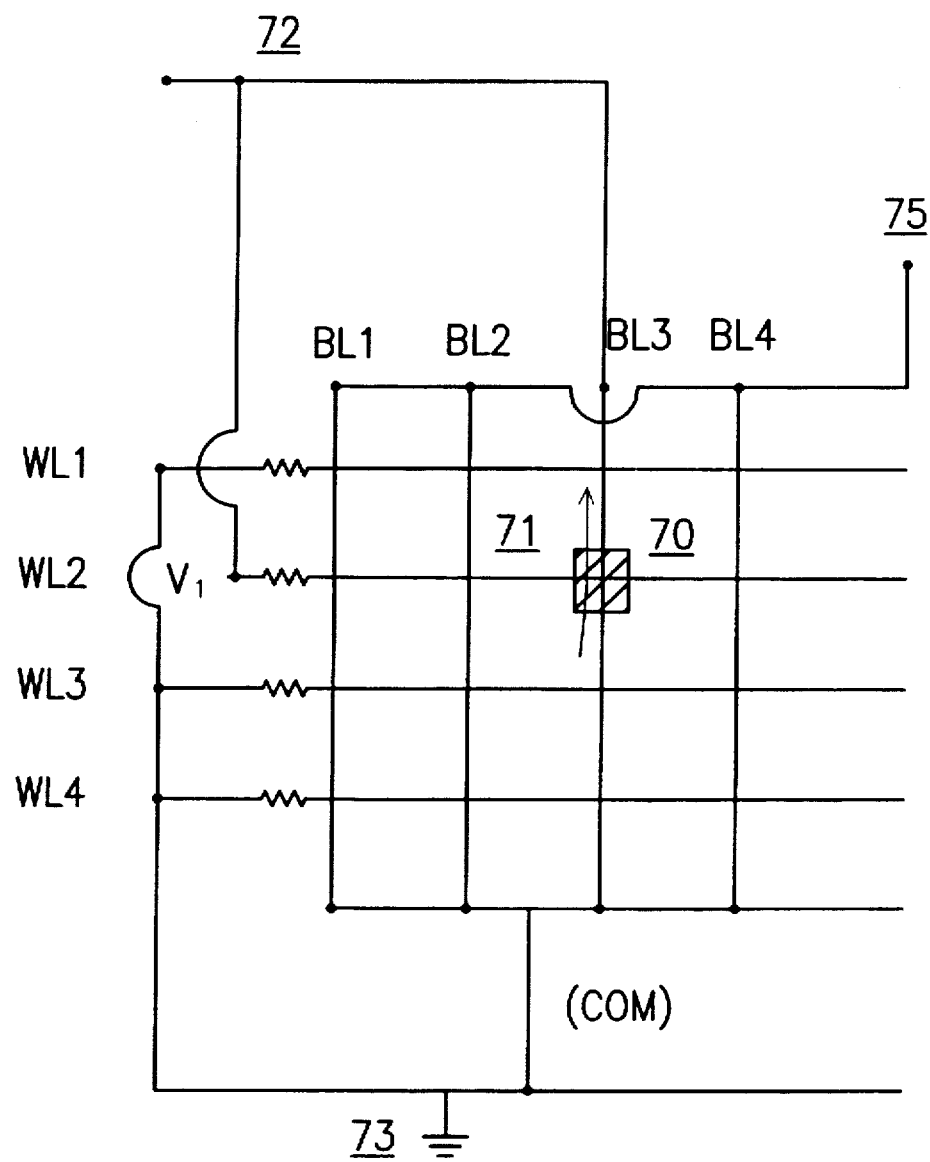
FIG. 7 shows an equivalent circuit diagram of a memory unit of a NPNP type silicon controlled rectifier ROM according to one preferred embodiment of the invention.

In the previous embodiment, a PNPN type of silicon controlled rectifiers is chosen as an example. An NPNP type of silicon controlled rectifiers can, however, be similarly used as memory units. An NPNP type of silicon controlled rectifier is shown in FIG. 7. A memory unit 70, for example, a memory unit having a contact window or a conducting memory unit, selected for a read operation can be decoded by applying a first voltage 72 to its electrically coupled triggering word line electrode WL2 of, for example, about −2.5V, and applying a second voltage 73 to all the remaining non-selected triggering word line electrodes. The second voltage 73 is very much smaller than the first voltage 72. For example, the second voltage 73 is a negative voltage of about −5V. Also, a voltage exactly the same as the first voltage 72 of, for example, about −2.5V, is applied to the bit line electrode BL3 that is electrically coupled to the memory unit 70 and a third voltage 75 is applied to the remaining non-selected bit line electrodes. The third voltage 75 is bigger than both the first voltage 72 and the second voltage 73 of, for example, about 0V, and the third voltage 75 is also applied to the common electrode COM. Voltage relationships between the three voltages can be summarized by the following inequality:

second voltage 73<<first voltage 72<third voltage 75

With the above electrical arrangements, the silicon controlled rectifier becomes conducting and current can flow from the common electrode COM towards bit line electrode BL3, as shown by the arrow 71 of FIG. 7. Current detected in the common electrode can be used for decoding purposes such that stored data bit in memory unit 70 can be regarded as having a logic "1," or an ON state. Owing to the shut-off configuration for the remaining non-selected silicon controlled rectifier memory units, current will not flow from the common electrode and no decoding acts are attempted.

While the invention has been described by way of example and in terms of the preferred embodiment, it is to be understood that the invention is not limited to the disclosed embodiments. To the contrary, inventions consistent with the disclosed invention are intended to cover various modifications and similar arrangements apparent to those skilled in the art. Therefore, the scope of the appended claims, which define the invention, should be accorded the broadest interpretation so as to encompass all such modifications and similar structures.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A decoding method for a silicon controlled rectifier ROM matrix comprised of at least a column of memory units and at least a row of memory units, wherein memory units of a respective row are electrically coupled to a common triggering word line electrode and each row of memory units is electrically coupled to a respective triggering word line electrode, and wherein memory units of a respective column are electrically coupled to a common bit line electrode and each column is coupled to a respective bit line electrode, wherein each memory unit comprises a first PNP transistor having a base terminal electrically coupled to a triggering word line electrode and emitter terminal electrically coupled to a bit line electrode, and a second NPN transistor having an emitter terminal electrically coupled to a common emitter terminal electrode, comprising steps of:

selecting a memory unit for memory read by applying a first voltage to a triggering word line electrode connected to a particular memory unit while applying a second voltage to triggering word line electrodes connected to memory units other than the particular memory unit, wherein the second voltage is greater than the first voltage;

applying the first voltage to a bit line electrode connected to the particular memory unit while applying a third voltage to bit line electrodes of memory units other than the particular memory unit, wherein the third voltage is less than both the first and the second voltages;

applying the third voltage to the common electrode; and decoding by sensing current flowing in the common electrode.

2. A method according to claim 1, wherein the step of decoding includes a substep of sensing current flowing in the selected bit line electrode.

3. A method according to claim 1, wherein the third voltage is substantially equal to ground.

4. A decoding method for a silicon controlled rectifier ROM matrix comprised of at least a column of memory units and at least a row of memory units, wherein memory units of a respective row are electrically coupled to a common triggering word line electrode and each row of memory units is electrically coupled to a respective triggering word line electrode, and wherein memory units of a respective column are electrically coupled to a common bit line electrode and each column is coupled to a respective bit line electrode, wherein each memory unit comprises a first NPN transistor having a base terminal electrically coupled to a triggering word line electrode and emitter terminal electrically coupled to a bit line electrode, and a second PNP transistor having an emitter terminal electrically coupled to a common emitter terminal electrode, comprising steps of:

selecting a memory unit for memory read by applying a first voltage to a triggering word line electrode connected to a particular memory unit while applying a second voltage to triggering word line electrodes connected to memory units other than the particular memory unit, wherein the second voltage is less than the first voltage;

applying the first voltage to the bit line electrode connected to the particular memory to be read while applying a third voltage to the remainder of the bit line electrodes connected to memory units other than the particular memory unit, wherein the third voltage is greater than both the first and the second voltages;

applying the third voltage to the common electrode; and decoding by sensing current flowing in the common electrode.

5. A method according to claim 4, wherein the step of decoding includes a substep of sensing current flowing in the bit line electrode connected to the memory unit to be read.

6. A method according to claim 4, wherein the first voltage is a negative voltage.

7. A method according to claim 4, wherein the second voltage is a negative voltage.

8. A method according to claim 4, wherein the third voltage is a negative voltage.

* * * * *